Jan. 26, 1965 F. BENDER 3,167,682

CIRCUIT ARRANGEMENT FOR GENERATING A VOLTAGE WITH AN IMPULSE AND A SAWTOOTH COMPONENT FOR FEEDING A LOW-IMPEDANCE LOAD

Filed Oct. 28, 1959

Fredrich Bender Inventor:

by Attorney:

Michael S. Striker

United States Patent Office
3,167,682
Patented Jan. 26, 1965

3,167,682
CIRCUIT ARRANGEMENT FOR GENERATING A VOLTAGE WITH AN IMPULSE AND A SAWTOOTH COMPONENT FOR FEEDING A LOW-IMPEDANCE LOAD

Friedrich Bender, Weiterstadt, near Darmstadt, Germany, assignor to Fernseh G.m.b.H., Am Alten Bahnhof, Darmstadt, Germany
Filed Oct. 28, 1959, Ser. No. 849,215
Claims priority, application Germany, Oct. 29, 1958, F 26,911
8 Claims. (Cl. 315—27)

For special purposes in television technique there is required a sawtooth generator in the form of a current source which generates a combination of sawtooth current and impulses and at the same time possess a low impedance. Such a generator is desired, for example, when it is necessary to supply the deflection currents necessary for the line deflection coils of cathode ray tubes, for example pickup tubes, by way of cables. In order to avoid distortion of the impulse or sawtooth the cable should be reflectionlessly terminated. An example of such an application is a small vidicon camera which is to be lowered down a bore-hole on a long cable.

It is in fact already known to generate such combined impulses, for example by charging a condenser through a resistance and discharging the condenser through a resistance and a valve. There thus results a sawtooth during the charging process and a rectangular impulse during the discharging process. In the formerly known circuit the impulse is generated in sequence with the sawtooth. The internal resistance of such a source is however very high and such a circuit cannot therefore be used for the stated purpose.

The arrangement according to the invention for generating a deflection current including an impulse and a sawtooth component for feeding a low-impedance load is characterized therein, that the impulse component is added to the integrated sawtooth component by voltage division or by transformation. Such a circuit arrangement also possesses in addition to the advantage of low internal resistance the possibility of a variable adjustment of the ratio of the impulse and sawtooth components for the purpose of linearizing the sawtooth current in the load.

In what follows embodiments of the invention are further explained with reference to the FIGURES 1 to 5.

Figure 1:
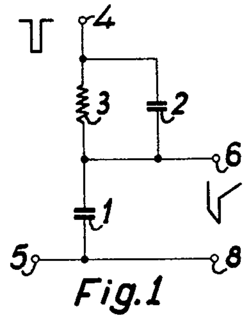
FIG. 1 is a circuit diagram of one embodiment of the invention, with a capacitive output impedance.

In FIGURE 1 is shown a series combination of a condenser 1 with an RC circuit, consisting of a condenser 2 in parallel with a resistance 3. A rectangular impulse is applied to the input terminal 4. Terminal 5 is earthed, and between terminals 6 and 8 the combined impulses may be obtained when carrying out the principle of the present invention. The parameters of the circuit components can be determined easily in well known manner so as to furnish the desired time constants, in which case the circuit behaves as follows: when the condenser 1 discharges, an integration current determined by condenser 1 flows through resistance 3 while a sawtooth voltage is produced across condenser 1. The rectangular impulse component is added to the sawtooth voltage at terminal 6 by way of the capacitive voltage divider formed by condensers 2 and 1. A low-impedance source for the combination of impulses is thus obtained, the internal impedance of which is substantially determined by capacitor 1.

Figure 2:
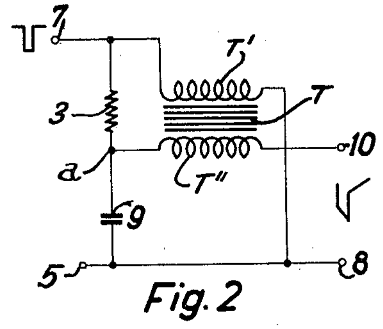
FIG. 2 is a circuit diagram illustrating a modification of FIG. 1.

In FIGURE 2 is shown the possibility of introducing the rectangular impulse not by voltage division but by transformation and by adding it to the sawtooth voltage. On applying a rectangular voltage impulse to the terminals 7 and 5 a sawtooth voltage results from integration in condenser 9, as in FIGURE 1. The rectangular impulse is added to the sawtooth voltage by transformation i.e., by passing the impulse through the primary T' of a transformer T, the secondary T'' of which is connected between the output terminal 10 and the junction point *a* between resistor 3 and condenser 9. Consequently, the sawtooth voltage and the superimposed rectangular impulse having an amplitude determined by the transformation ratio of transformer T may be taken together from terminals 8 and 10.

Figure 3:
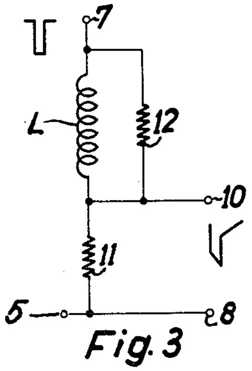
FIG. 3 is a circuit diagram of another embodiment of the invention with an ohmic output impedance.

A further example is illustrated in FIGURE 3. In this circuit a series-combination is used which comprises an inductance L and as the integrating component the resistance 11, across which the sawtooth component is produced. The rectangular impulse voltage applied between terminals 7 and 5 is added by way of resistance 12 to the sawtooth component as an impulse component, so that the mixture of rectangular pulse and sawtooth can be taken from terminals 8 and 10.

Figure 4:
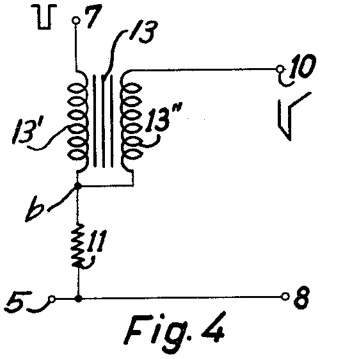
FIG. 4 is a circuit diagram illustrating a modification of FIG. 3.

In FIGURE 4 the sawtooth component is produced by the integrating resistance 11, while the rectangular impulse component is added by way of the transformer 13 the primary 13' whereof acts as inductance as in the embodiment of FIG. 3, while its secondary 13'' is connected between output terminal 10 and a junction point *b* between the resistor 11 and the primary 13', so that the mixture of sawtooth and impulse results at the terminals 6 and 8.

Figure 5:
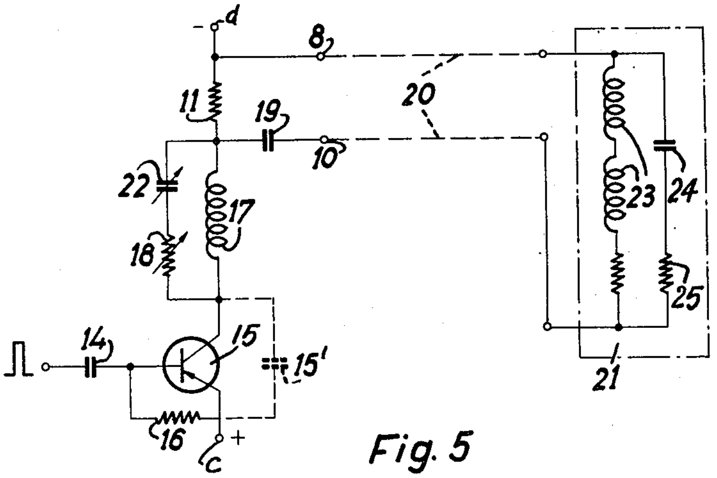
FIG. 5 illustrates the application of a circuit arrangement according to FIG. 3 to a transmission line system.

While the examples given above show the principle of the invention in various cases, in FIGURE 5 there is shown a practical circuit which may be used to feed the line deflection coils of a remotely installed camera tube with deflection currents in linear form. In this circuit positive impulses are fed to the base of a transistor 15 by way of a condenser 14. The resistance 16 is the connection from the base to the emitter and in conjunction with the condenser 14 generates the base bias voltage. During the long period of each entire impulse cycle current flows through the resistance 11, the inductance 17 and the transistor 15; during the short duration of the impulse itself the transistor 15 is substantially blocked wherefrom a negative impulse results at the transistor end of the coil 17 corresponding to the negative pulse applied to terminal 7 of FIG. 3. This impulse is added by a way of a voltage divider which consists of the resistance 18, the condenser 22 and the residual impedance of the transistor 15, which takes the form of a capacitance and is indicated by the symbol of a condenser 15' shown in broken lines, to the sawtooth voltage which appears across the integrating resistance 11 and is applied to the load. The load is formed by a condenser 19, a cable 20 and a cable-terminating network 21, which may contain the deflection coils 23 to be driven by the sawtooth current. In parallel with the inductance 17 is connected the series combination of a resistance 18 and a condenser 22, both of which are adjustable. By altering the value of the resistance 18 the ratio between the amplitudes of the rectangular impulse and the sawtooth may be simply adjusted and by adjustment of the condenser 22 the linearity of the sawtooth component may be adjusted. The condenser 19 serves to keep the cable free of direct current. The amplitude of the mixture of sawtooth and rectangular impulse is regulated by altering the voltage of the source of direct current supply indicated at *c* and *d*. The circuit so constructed works satisfactorily even with a cable 500 m. long, since because of the low internal impedance of the impulse source the low-impedance of the cable 20 amounting to, for example, 60 ohms, is easily matched. In operation the following values have proved advantageous for producing the line deflection current for the normal German line frequency:

Condensers: 14—1 $\mu$f.; 19—50 $\mu$f.; 22—0.1 $\mu$f. adjustable.
Transistor 15—type 2N257 (Clevite).
Resistors: 16—250Ω; 11—500Ω; 18—500Ω adjustable.
Inductance 17—4 mh.

It is advantageous to connect in series with the deflection system 23 having an inductance L a resistance of the value of the characteristic impedance Z of the cable 20 and in parallel with the two coils 23*a* series combination of a capacitance 24 of magnitude $C=L/Z^2$ and a resistance 25 of magnitude Z.

What is claimed as new and desired to be secured by Letters Patent is:

1. Circuit arrangement for feeding a low impedance transmission line with a voltage consisting of a square wave component and a sawtooth component, comprising, in combination, input means for introducing a sequence of square wave impulses; an integrating network, comprising a resistance member and an inductive reactance member in series, said input means being connected to the ends of said integrating network, respectively; output means including a first output terminal connected to one end of said resistance member and a second output terminal connected to the junction point between said resistance member and said inductive reactance member for delivering a sawtooth voltage derived from said resistance member upon application of said square wave impulses; and impedance means connected between said junction point and said input means for superimposing a square wave voltage, proportional to said square wave impulses, on said sawtooth voltage, said impedance means being selected to produce linearity of said sawtooth voltage and a desired amplitude ratio between said square wave and said sawtooth voltages.

2. Circuit arrangement for feeding a low impedance transmission line with a voltage consisting of a square wave component and a sawtooth component, comprising, in combination, input means for introducing a sequence of square wave impulses; an integrating network, comprising a resistive impedance member and a capacitive reactance member in series, said input means being connected to the ends of said integrating network, respectively; output means including a first output terminal connected to one end of said capacitive reactance member and a second output terminal connected to the junction point between said impedance and reactance members, for delivering a sawtooth voltage derived from said capacitive reactance member upon application of said square wave impulses; and a second capacitive reactance member connected in parallel across across said resistive impedance member between said junction point and said input means for superimposing a square wave voltage, proportional to said square wave impulses, on said sawtooth voltage.

3. Circuit arrangement for feeding a low impedance transmission line with a voltage consisting of a square wave component and a sawtooth component comprising, in combination, input means for introducing a sequence of square wave impulses; an integrating network comprising a resistance member and an inductance member in series, said input means being connected to the ends of said integrating network, respectively; output means including a first output terminal connected to one end of said resistance member and a second output terminal connected to the junction point between said resistance member and said inductance member for delivering a sawtooth voltage derived from said resistance member upon application of said square wave impulses; and an auxiliary circuit including a second resistance member connected in parallel across said inductance member between said junction point and said input means for superimposing a square wave voltage, proportional to said square wave impulses, on said sawtooth voltage.

4. Circuit arrangement according to claim 3, wherein said auxiliary circuit includes a variable condenser connected in series with said second resistance member, said variable condenser being dimensioned to constitute at the frequency of said square wave impulses a comparatively low impedance relative to that of said second resistance member.

5. Circuit arrangement for feeding a low impedance transmission line with a voltage consisting of a square wave component and a sawtooth component comprising, in combination, input means for introducing a sequence of square wave impulses; an integrating network comprising a resistive impedance member and a capacitive impedance member in series, said input means being connected to the ends of said integrating network, respectively; output means including two output terminals, one of which is connected directly to said input means; transformer means having a primary and a secondary winding, said secondary winding being connected between the other one of said output terminals and a junction point between said two impedance members, and said primary winding being connected between said input means and said one of said output terminals, whereby upon application of said square wave impulses a sawtooth voltage derived from said capacitive impedance member is superimposed at said output terminals, on a square wave voltage proportional to said square wave impulses and delivered by said secondary winding of said transformer means.

6. Circuit arrangement for feeding a low impedance transmission line with a voltage consisting of a square wave component and a sawtooth component, comprising, in combination, input means for introducing a sequence of square wave impulses; transformer means comprising a primary and a secondary winding, said primary winding constituting an inductance member, connected at one end with one of said input terminals; a resistance member connected in series with said primary winding between the other end of the latter and said input means to constitute together with said inductance member an integrating network; output means including two output terminals, one of which is connected to said input means, the other being connected with one end of said secondary winding of said transformer, the other end of said secondary winding being connected with a junction point between said primary winding and said resistance member, whereby upon application of said square wave impulses a sawtooth voltage derived from said resistance member is superimposed, at said output terminals, on a square wave voltage proportional to said square wave impulses and delivered by said secondary winding of said transformer means.

7. Circuit arrangement for feeding a low impedance transmission line with a voltage consisting of a square wave component and a sawtooth component, comprising in combination, input means for introducing square wave impulses and including at least one input terminal, and a transistor having a base, emitter and collector, said base being connected with said input terminal; an integrating network comprising an inductance member and a first resistance member in series for producing a square tooth voltage upon introduction of said square wave impulses, a series combination including a second variable resistance member and a variable condenser shunted in parallel to said inductance member of said integrating network, said collector being connected to one end of said inductance member, said variable condenser and resistance member being adjustable to produce, respectively, linearity of said sawtooth voltage and a desired amplitude ratio between said square wave and sawtooth voltages;

a source of constant voltage being connected with its positive pole to said emitter, and with its negative pole to the other end of said first resistance member; output means including two output terminals, one of which is connected to a junction point between said first resistance member and said inductance member, the other output terminal being connected to said other end of said first resistance member, whereby upon application of said square wave impulses to said input means a sawtooth voltage derived from said first resistance member is superimposed, at said output terminals, on a square wave voltage proportional to said square wave impulses and delivered also at said output terminals.

8. Circuit arrangement for feeding a remotely installed television camera tube system with an alternating voltage wave consisting of a square wave component and a sawtooth component, comprising, in combination, a tube system including input terminals, deflection coils having an inductivity L, ohmic resistance means connected as a first series-combination with said coils and having a resistance value Z, said first series combination being connected between said input terminals, a second series-combination of a capacitance member having a capacitance $C=L/Z^2$ and a resistance member having a resistance value Z, said second series combination being connected in parallel with said first series-combination; input means for applying square wave impulses and including at least one input terminal, a transistor having a base, emitter and collector, said base being connected with said input terminal; an integrating network comprising an inductance member and a first resistance member in series, said first resistance member producing a sawtooth voltage in response to the application of said square wave impulses, a third series-combination including a second, variable resistance member and a variable condenser shunted in parallel to said inductance member of said integrating network, said variable condenser and resistance member being adjustable to produce, respectively, linearity of said sawtooth voltage and a desired amplitude ratio between said square wave and sawtooth voltages, said collector being connected to one end of said inductance member; a source of constant voltage being connected with its positive pole to said emitter and with its negative pole to the other end of said first resistance member; output means including two output terminals, one of which is connected to a junction point between said first resistance member and said inductance member, the other output terminal being connected to said other end of said first resistance member; and transmission cable means having a wave impedance Z substantially equal to the resistance value of said resistance means and of said first resistance member and connected between said output terminals of said integrating network and said input terminals of said camera tube system.

References Cited in the file of this patent

UNITED STATES PATENTS

| | | |
|---|---|---|
| 2,144,351 | Vance | Jan. 17, 1939 |
| 2,251,973 | Beale et al. | Aug. 12, 1941 |
| 2,369,824 | Hallmark | Feb. 20, 1945 |
| 2,891,192 | Goodrich | June 16, 1959 |
| 2,911,566 | Taylor | Nov. 3, 1959 |
| 2,913,625 | Finkelstein | Nov. 17, 1959 |